United States Patent [19]

Boord et al.

[11] Patent Number: 4,533,872
[45] Date of Patent: Aug. 6, 1985

[54] MAGNETIC FIELD SENSOR ELEMENT CAPABLE OF MEASURING MAGNETIC FIELD COMPONENTS IN TWO DIRECTIONS

[75] Inventors: Warren T. Boord, Brooklyn Park; Richard B. Fryer, Minnetonka, both of Minn.

[73] Assignee: Honeywell Inc., Minneapolis, Minn.

[21] Appl. No.: 388,066

[22] Filed: Jun. 14, 1982

[51] Int. Cl.$^3$ .................. G01R 33/06; G01C 17/00; H01L 43/08
[52] U.S. Cl. .................. 324/252; 33/319; 324/247; 338/32 R
[58] Field of Search ............. 324/208, 207, 244, 247, 324/249, 251, 252; 338/32 R; 360/113; 33/319, 355 R, 361

[56] References Cited

U.S. PATENT DOCUMENTS

| | | | |
|---|---|---|---|
| 4,012,781 | 3/1977 | Lin | 324/252 X |
| 4,024,489 | 5/1977 | Bajorek et al. | 324/252 X |
| 4,079,360 | 3/1978 | Ookubo et al. | 324/252 X |
| 4,296,377 | 10/1981 | Ohkubo | 324/252 |
| 4,401,944 | 8/1983 | Narimatsu et al. | 324/252 X |

FOREIGN PATENT DOCUMENTS 26814  2/1977  Japan .................. 324/252

OTHER PUBLICATIONS

Hebbert et al., "Thin Film Magnetoresistance Magnetometer"; The Review of Scientific Instruments; vol. 37, No. 10, Oct. 1966, pp. 1321–1323.

Primary Examiner—Gerard R. Strecker
Attorney, Agent, or Firm—Stephen W. Buckingham

[57] ABSTRACT

A magnetic field sensor which may be rendered preferentially sensitive to magnetic field components in each of two, preferably orthogonal, directions by application of appropriate magnetic bias fields is disclosed.

25 Claims, 5 Drawing Figures

MAGNETIC FIELD SENSOR ELEMENT CAPABLE OF MEASURING MAGNETIC FIELD COMPONENTS IN TWO DIRECTIONS

The present invention relates to electronic sensors used to determine the direction of an external magnetic field.

BACKGROUND OF THE INVENTION

Electronic sensors for determining the direction of an external magnetic field are well known in the art in a variety of contexts. One particularly important use of such sensors is to determine the orientation of the sensor with respect to the magnetic field of the earth. When such a sensor is employed in this way it is often called an electronic compass.

Electronic compasses have numerous advantages over conventional compasses utilizing a piece of magnetized metal to indicate direction. One such advantage is that a typical electronic compass may be much smaller in size than a typical magnetized metal compass. A second advantage is that an electronic compass provides an electrical output allowing a simple interface with other electronic circuitry such as an electronic navigation system. A third advantage is that an electronic compass is not affected by acceleration or deceleration of a vehicle in which the compass is carried.

Typical prior art electronic compasses use at least two magnetic field sensors to determine the user's orientation with respect to the earth's magnetic field. The reason for this may be seen by reference to FIG. 1. In FIG. 1 $\vec{H}_H$ represents the horizontal component of the earth's magnetic field, which, by definition, points in the direction of magnetic north. If the user is traveling in the direction indicated by $\vec{H}_\parallel$ the angle $\theta$ would be the compass bearing indicating the direction of travel. If $\vec{H}_\parallel$ indicates the component of $\vec{H}_H$ in the desired direction a function $A[\vec{H}_\parallel]$ may be defined such that $$A[\vec{H}_\parallel] = |\vec{H}_H| \cos \theta \qquad (1)$$

Those skilled in the art will readily perceive that $A[\vec{H}_\parallel]$ corresponds to the magnitude of $\vec{H}_\parallel$ if $0° \leq \theta \leq 90°$ or $270° \leq \theta \leq 360°$ and the negative of the magnitude of $\vec{H}_\parallel$ if $90° \leq \theta \leq 270°$. Therefore, $$\theta = \cos^{-1} \frac{A[\vec{H}_\parallel]}{|\vec{H}_H|} \qquad (2)$$

A knowledge of the magnitude of $\vec{H}_\parallel$ alone will not provide sufficient information to allow calculation of the angle $\theta$, however. This is because the magnitude of $\vec{H}_H$ varies with latitude. This variation of $\vec{H}_H$ may be seen by representing the earth's magnetic field as that produced by a magnetic dipole with dipole moment $\vec{M}$ located at the center of the earth. In this approximation $$|\vec{H}_H| = -|\vec{M}/r^3| \sin (90° - \gamma) \qquad (3)$$

where r is the radius of the earth and $\gamma$ is the latitude. Clearly, therefore, the magnitude of $\vec{H}_H$, and hence that of $\vec{H}_\parallel$, will vary from one latitude to another even when $\theta$ remains constant.

One method used in the prior art to overcome this problem is to use two magnetic field sensors. One sensor measures $A[\vec{H}_\parallel]$ as defined above while the second measures $A[\vec{H}_\perp]$, where $\vec{H}_\perp$ is the component of $\vec{H}_H$ perpendicular to $\vec{H}_\parallel$. Because the sensor measuring $A[\vec{H}_\perp]$ is oriented perpendicularly to the one measuring $A[\vec{H}_\parallel]$ the following relation arises $$A[\vec{H}_\perp] = |\vec{H}_H| \cos(\theta - 90°) = |\vec{H}_H| \sin \theta \qquad (4)$$

Using equations (1) and (4) and defining the $\tan^{-1}$ function in the range $0° \leq \theta < 180°$ the angle $\theta$ can be calculated as shown in equation (5) below if $\theta$ falls within the range over which the $\tan^{-1}$ function is defined.

$$\theta = \tan^{-1} \frac{A[\vec{H}_\perp]}{A[\vec{H}_\parallel]} \qquad (5)$$

If $\theta$ does not fall in the range given above it may be calculated as $$\theta = 180° + \tan^{-1} \frac{A[\vec{H}_\perp]}{A[\vec{H}_\parallel]} \qquad (5')$$

A determination of whether to use equation (5) or (5') may be made by examining $A[\vec{H}_\parallel]$ and $A[\vec{H}_\perp]$. If $A[\vec{H}_\perp] > 0$ or if $A[\vec{H}_\perp] = 0$ and $A[\vec{H}_\parallel] > 0$, $0° \leq \theta < 180°$ and equation (5) is used. Otherwise equation (5') is used.

A second method of the prior art uses three sensors to measure magnetic field components in three directions, each oriented at an angle of 120° from the other two. The magnitude of any two of these components may then be used to calculate the value of the angle $\theta$.

A problem inherent in electronic compasses utilizing multiple sensors is that such systems depend on those sensors having substantially identical operating characteristics if the output of the sensors is to be used directly to evaluate equation (5) without substantial additional processing to correct for differences in such operating characteristics. Typical semiconductor fabrication processes do not produce such uniform sensors, however. A variation in operating characteristics of up to 5% is common among magnetic field sensors produced on a single semiconductor wafer.

SUMMARY OF THE INVENTION

In the present invention a magnetic field sensor element which may be rendered preferentially sensitive to external magnetic field components in each of two, preferably orthogonal, directions is used. When a first magnetic bias field is applied to the sensor element the sensor is rendered sensitive to external magnetic field components in a first direction. When a second magnetic bias field is applied to the sensor element the sensor is rendered sensitive to external magnetic field components in a second direction. The external magnetic field components measured by the sensor in this manner may then be used to calculate the orientation of the sensor with respect to the direction of the external magnetic field.

DESCRIPTION OF THE PREFERRED EMBODIMENT

In the preferred embodiment four magnetoresistive elements arranged in a Wheatstone bridge configuration are used to sense external magnetic fields. A magnetoresistive material is one which varies in electrical resistance in response to changes in an external magnetic field. A preferred magnetoresistive material is an iron-nickel alloy of the type known in the art as permalloy and specifically that alloy having 19% iron and 81% nickel. Such a composition is preferred because magnetoresistors having this composition will exhibit a strong magnetoresistive effect but little or no magnetostrictive effect. Other types of sensor or other configurations of magnetoresistive sensors are possible. The critical feature that the sensor must exhibit is that it must be capable of being made preferentially sensitive to magnetic field components in at least two directions by the application of appropriate magnetic bias fields.

Figure 1:
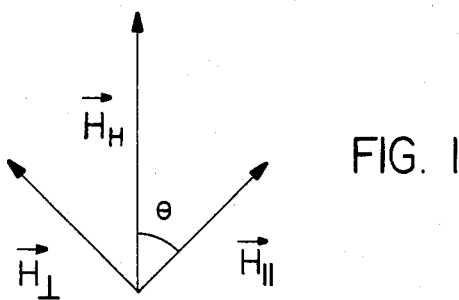
FIG. 1 is a vector diagram showing the relationship of the horizontal component of the earth's magnetic field, $\vec{H}_H$, the component of $\vec{H}_H$ parallel to the direction of travel, $\vec{H}_\parallel$, and the component of $\vec{H}_H$ perpendicular to the direction of travel, $\vec{H}_\perp$.
Figure 2:
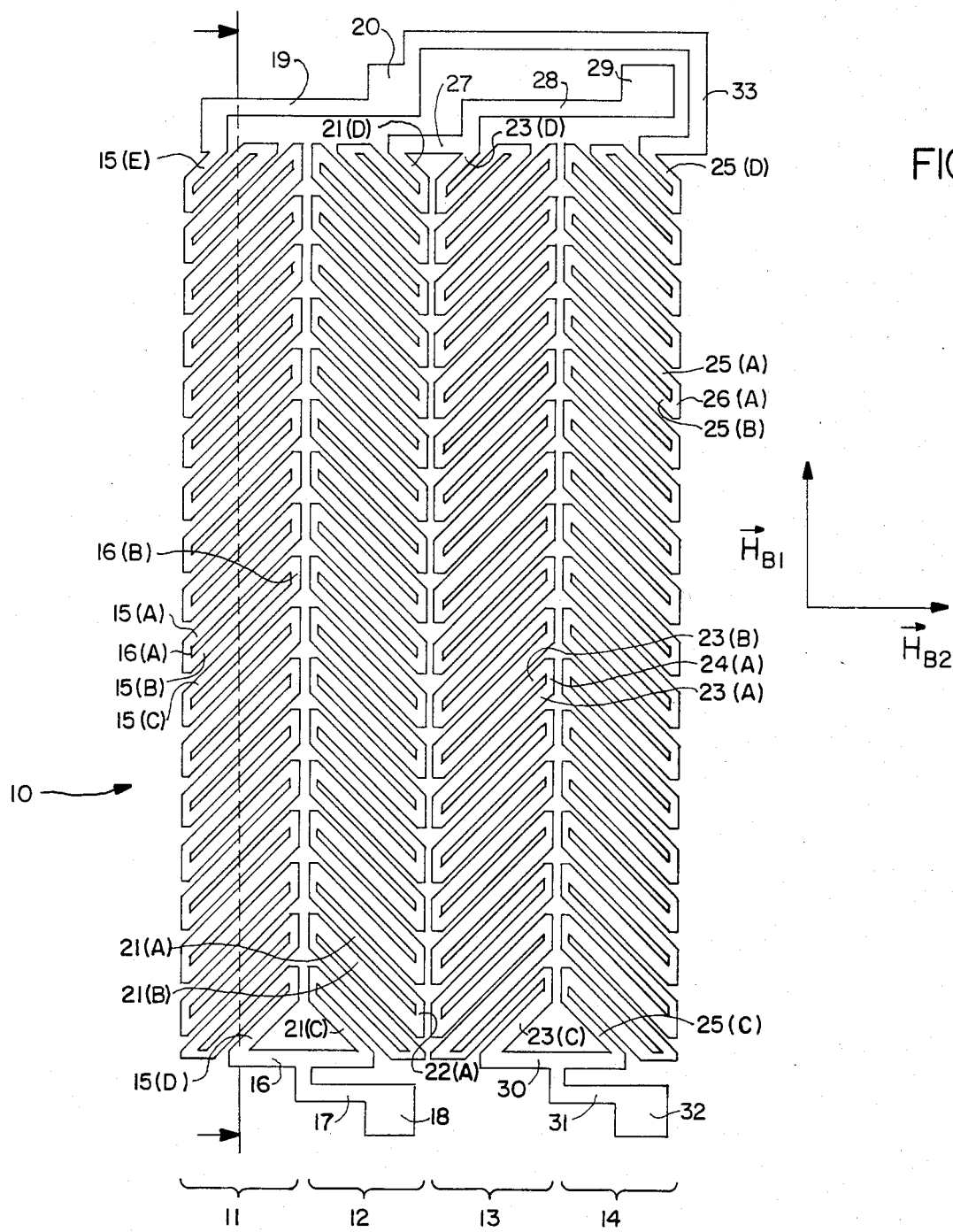
FIG. 2 is a top view of the structure of a preferred embodiment of the invention.

Turning now to FIG. 2, a magnetic field sensor element, designated generally by reference numeral 10, is shown. Sensor element 10 includes four magnetoresistive elements, 11, 12, 13, and 14. Each of magnetoresistive elements 11, 12, 13, and 14 include a plurality of major legs. Magnetoresistive element 11 includes, for example, major legs 15(A), 15(B), and 15(C). Major legs 15(A) and 15(B) of magnetoresistive element 11 are electrically connected to one another by connecting element 16(A). Likewise major leg 15(B) is electrically connected to major leg 15(C) by connecting element 16(B). These and similar major legs and connecting elements form magnetoresistive element 11. At one end of magnetoresistive element 11 major leg 15(D) is electrically connected to electrical conductor 16. Electrical conductor 16 is electrically connected to contact pad 18. At the other end of magnetoresistive element 11 major leg 15(E) is electrically connected to electrical conductor 19, which in turn is electrically connected to contact pad 20. Therefore a complete electrical conduction path exists between contact pad 18 and contact pad 20 through magnetoresistive element 11.

Magnetoresistive elements 12, 13, and 14 are constructed similarly to magnetoresistive element 11. Magnetoresistive element 12 includes major legs such as major legs 21(A) and 21(B) and electrical connecting elements such as electrical connecting element 22(A). Similarly magnetoresistive element 13 includes major legs such as major legs 23(A) and 23(B) and electrical connecting elements such as electrical connecting element 24(A), while magnetoresistive element 14 includes major legs such as major legs 25(A) and 25(B) and electrical connecting elements such as electrical connecting element 26(A).

The final major leg 21(C) at one end of magnetoresistive element 12 is electrically connected to electrical conductor 16 and hence to contact pad 18 through electrical conductor 17. The final major leg 21(D) at the other end of magnetoresistive element 12 is electrically connected to electrical conductor 27. Electrical conductor 27 is electrically connected to electrical conductor 28, which is electrically connected to contact pad 29.

The final major legs 23(C) and 25(C) at one end of magnetoresistive elements 13 and 14 respectively are each connected to electrical conductor 30. Electrical conductor 30 is electrically connected to electrical conductor 31 which is in turn electrically connected to contact pad 32. The final major leg 23(D) at the other end of magnetoresistive element 13 is electrically connected to electrical conductor 27 and hence to contact pad 29. The final major leg 25(D) at the other end of magnetoresistive element 14 is electrically connected to electrical conductor 33 which is in turn electrically connected to contact pad 20.

Figure 3:
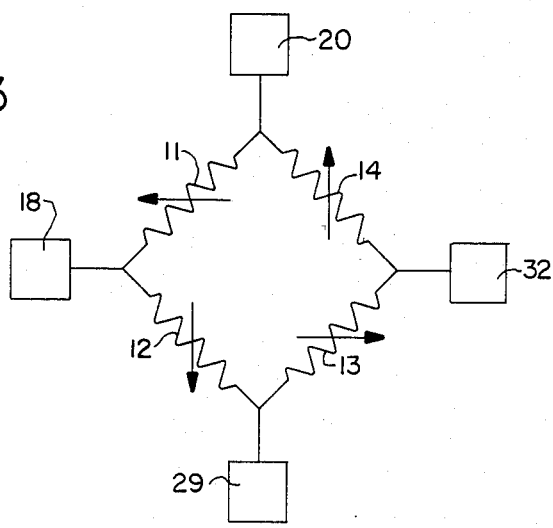
FIG. 3 is an electrical schematic diagram of the equivalent circuit of the structure shown in FIG. 2.

The effective electrical network formed by the structure shown in FIG. 2 may be more easily visualized by reference to FIG. 3. FIG. 3 is an electrical schematic diagram of the network formed by the structure of FIG. 2. In FIG. 3 the same reference numeral is used to designate elements as was used to designate corresponding elements in FIG. 2. In FIG. 3 the bridge structure of the sensor is readily apparent. Magnetoresistors 11 and 12 are electrically connected to contact pad 18 and magnetoresistors 13 and 14 are electrically connected to contact pad 32. Further magnetoresistors 11 and 14 are electrically connected to contact pad 20 and magnetoresistors 12 and 13 are electrically connected to contact pad 29. Contact pads 20 and 29 are electrically connected to a voltage source, not shown, and the resulting electrical potential difference between contact pads 18 and 32 serves as the sensor output. Changes in the applied magnetic field will cause changes in the electrical resistance of magnetoresistors 11, 12, 13, and 14 and hence changes in the sensor output.

Returning to FIG. 2, the major legs of magnetoresistive element 12, such as major legs 21(A) and 21(B) run in a direction perpendicular to the major legs of magnetoresistive element 11, such as major legs 15(A) and 15(B). The major legs of magnetoresistive element 13 run in a direction parallel to the major legs of magnetoresistive element 11 and the major legs of magnetoresistive element 14 run in a direction parallel to the direction of the major legs of magnetoresistive element 12.

With the major legs of the magnetoresistive elements arranged as shown in FIG. 2, a magnetic bias field may be applied to magnetic field sensor element 10 in either of the directions indicated by the arrows $H_{B1}$ and $H_{B2}$ and in each case maintain an electrical current flow along the major legs at an angle of 45° to the bias field. When magnetic field sensor is biased in either of the directions shown by $H_{B1}$ or $H_{B2}$ the sensor will be preferentially sensitive to magnetic field components in a direction perpendicular to the bias field. The output voltage of a magnetoresistive bridge, such as is used in the invention, will be a voltage directly proportional to $A[H_x]$ if the magnetoresistive elements are biased for operation in the most linear portion of their response curve and the dynamic range of the external magnetic field does not exceed that linear range of the sensor. In this expression $H_x$ is used to represent the component of $H_H$ perpendicular to the bias field and would be either $H_\parallel$ or $H_\perp$. Because a single sensor is used to measure magnetic field components in each of the two directions and the current flow in the major legs of the magnetoresistive elements is always at the same angle to the bias field, the operating characteristics of the sensor will be the same when it is used to measure the magnetic field components in each of the two directions. Therefore the sensor output values may be easily combined to provide an indication of the sensor's orientation with respect to magnetic north.

Figure 4:
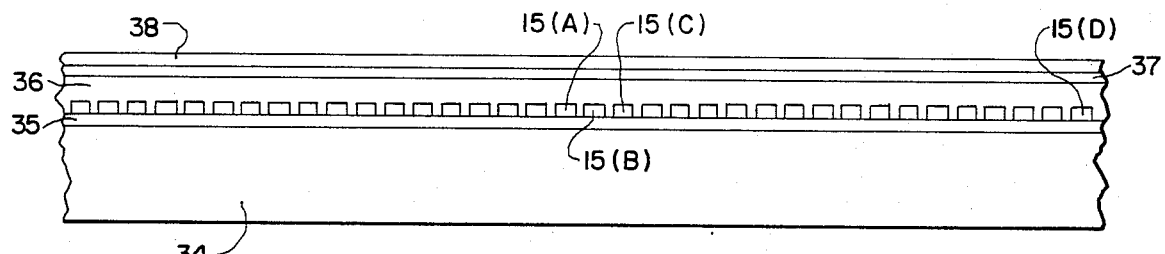
FIG. 4 is a cross sectional view of the structure shown in FIG. 2.

FIG. 4 is a cross sectional view of sensor 10 where the cross section is taken along the dashed line shown in FIG. 2. A semiconductor substrate 34, typically of silicon, has a dielectric 35 applied to its surface. Dielectric 35 may be any dielectric typically used with the material of substrate 34. When substrate 34 is of silicon, dielectric 35 would typically be silicon dioxide, silicon nitride, or a polyimide material. Magnetoresistors 10, 11, 12, and 13 are formed on dielectric 35. Only sensor 11 is visible in the cross section of FIG. 4. A second dielectric, 36, covers magnetoresistors 11, 12, 13, and 14. An electrical conductor, 37, covers dielectric 36. Typically electrical conductor 37 is aluminum, although other electrical conductors may be used. A third dielectric layer, 38, covers electrical conductor 37.

Electrical conductor 37 is used to provide a magnetic bias field to magnetoresistors 11, 12, 13 and 14. A bias field may be produced in the direction of $\overline{H}_{B1}$, shown in FIG. 2, by passing an electrical current through electrical conductor 37 in the direction parallel to $\overline{H}_{B2}$. A magnetic bias field may be produced in the direction of $\overline{H}_{B2}$ by passing an electrical current through electrical conductor 37 in the direction antiparallel to the direction of $\overline{H}_{B1}$. The electrical currents required to bias magnetoresistors 11, 12, 13, and 14 for operation within their linear response ranges are rather large by integrated circuit standards, but, by appropriate design of magnetoresistors 11, 12, 13, and 14, dielectric 36, and electrical conductor 37, those currents can be made to fall within a range which may be implemented in an integrated circuit. Additionally excessive heat build up may be avoided by providing electrical currents through electrical conductor 37 only when an indication of orientation with respect to an external magnetic field is required.

Figure 5:
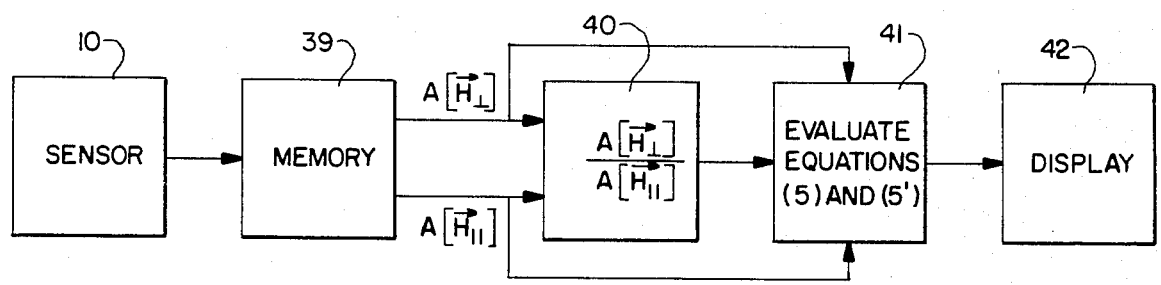
FIG. 5 is a block diagram of a system utilizing the invention.

FIG. 5 is a possible system configuration for an electronic compass using the magnetic field sensor of the present invention. In the use of the invention magnetic field components in a first direction, $A[\overline{H}_{\|}]$, are measured and stored in memory 39. Then magnetic field components in the second direction, $A[\overline{H}_{\perp}]$, are measured and also stored in memory 39. The two values determined in this manner are extracted from memory 39 and applied to the inputs of a divider circuit 40. The output signal from divider circuit 40 will represent the value of $A[\overline{H}_{\perp}]/A[\overline{H}_{\|}]$. This value is transferred to a calculating means 41 which determines the value of the angle $\theta$ using equations (5) and (5′) and the criteria described therewith. The value of the angle $\theta$ is then transferred to a display means 42 in order to give the operator an indication of orientation with respect to magnetic north.

The system of FIG. 5 is not intended to be exhaustive. Other means of calculating the angle $\theta$ are possible. For example, $A[\overline{H}_{\|}]$ may be divided by $A[\overline{H}_{\perp}]$ and the $\cot^{-1}$ may be used to determine the value of $\theta$. Also rather than transferring the value calculated for $\theta$ to a display for readout purposes, the value of $\theta$ may be transferred directly to other signal processing apparatus, such as an electronic navigation system. The system of FIG. 5 is provided only as one possible configuration in which the sensor of the invention could be used as a part of a complete electronic compass.

The embodiments of the invention in which an exclusive property or right is claimed are defined as follows:

1. A sensor useful in determining orientation with respect to an external magnetic field comprising:
   magnetic field sensing means having an output terminating region, said magnetic field sensing means being arranged to provide an output signal at said magnetic field sensing means output terminating region, said output signal being representative of external magnetic field components in a first direction when a first bias magnetic field is applied to said magnetic field sensing means in a second direction, and said output signal being representative of external magnetic field components in a third direction when a second magnetic bias field is applied to said magnetic field sensing means in a fourth direction;
   magnetic field biasing means adapted to provide said first and second magnetic bias fields to said magnetic field sensing means.

2. The sensor of claim 1 wherein said magnetic field biasing means comprises a first electrical conductor means adapted to conduct selectively a first electrical current in a direction perpendicular to said second direction and a second electrical current in a direction perpendicular to said fourth direction.

3. The sensor of claim 2 wherein said magnetic field biasing means is separated from said magnetic field sensing means by a first dielectric.

4. The sensor of claim 3 wherein said first direction is perpendicular to said third direction.

5. The apparatus of claim 4 wherein said first, second, third, and fourth directions lie in a common plane.

6. The sensor of claim 5 wherein said first direction is perpendicular to said second direction and said third direction is perpendicular to said fourth direction.

7. The sensor of claim 1, claim 2, or claim 3, claim 4, or claim 6 wherein said magnetic field sensing means includes first, second, third, and fourth electrical resistance means, each of said electrical resistance means including a magnetoresistive material and having first and second terminating regions, said first electrical resistance means first terminating region being electrically connected to said third electrical resistance means first terminating region, said first electrical resistance means second terminating region being electrically connected to said second electrical resistance means second terminating region, said third electrical resistance means second terminating region being electrically connected to said fourth electrical resistance means second terminating region, and said second electrical resistance means first terminating region being electrically connected to said fourth electrical resistance means first terminating region.

8. The sensor of claim 7 wherein said first electrical resistance means comprises a plurality of major legs, each of said first electrical resistance means major legs lying at an angle of 45° with respect to said first direction, said second electrical resistance means comprises a plurality of major legs each of said second electrical resistance means major legs lying perpendicular to said first electrical resistance means major legs, said third electrical resistance means comprises a plurality of major legs, each of said third electrical resistance means major legs being perpendicular to said first electrical resistance means major legs, and said fourth electrical resistance means comprises a plurality of major legs, each of said fourth electrical resistance means major legs being parallel to said first electrical resistance means major legs.

9. The sensor of claim 8 wherein said magnetoresistive material includes an iron-nickel alloy.

10. The sensor of claim 1 wherein said magnetic field biasing means is adapted to provide said first magnetic bias field during a first time period and said second magnetic bias field during a second time period, said first and second time periods being nonsimultaneous.

11. The sensor of claim 10 wherein said magnetic field biasing means comprises a first electrical conductor means adapted to conduct selectively a first electrical current in a direction perpendicular to said second direction and a second electrical current in a direction perpendicular to said fourth direction.

12. The sensor of claim 11 wherein said first, second, third, and fourth directions lie in a common plane.

13. The sensor of claim 12 wherein said magnetic field sensing means includes first, second, third, and fourth electrical resistance means, each of said electrical resistance means including a magnetoresistive material and having first and second terminating regions, said first electrical resistance means first terminating region being electrically connected to said third electrical resistance means first terminating region said first electrical resistance means second terminating region being electrically connected to said second electrical resistance means second terminating region, said third electrical resistance means second terminating region being electrically connected to said fourth electrical resistance means second terminating region and said second electrical resistance means first terminating region being electrically connected to said fourth electrical resistance means first terminating region.

14. The sensor of claim 13 wherein said first direction is perpendicular to said third direction.

15. The sensor of claim 14 wherein said first direction is perpendicular to said second direction and said third direction is perpendicular to said fourth direction.

16. The sensor of claim 15 wherein said first electrical resistance means comprises a plurality of major legs, each of said first electrical resistance means major legs lying at an angle of 45° with respect to said first direction, said second electrical resistance means comprises a plurality of major legs each of said second electrical resistance means major legs lying perpendicular to said first electrical resistance means major legs, said third electrical resistance means comprises a plurality of major legs, each of said third electrical resistance means major legs being perpendicular to said first electrical resistance means major legs, and said fourth electrical resistance means comprises a plurality of major legs, each of said fourth electrical means major legs being parallel to said first electrical resistance means major legs.

17. The sensor of claim 16 wherein said magnetoresistive material includes an iron-nickel alloy.

18. The sensor of claim 1 wherein each of said second and fourth directions is fixed with respect to said sensor.

19. The sensor of claim 18 wherein said magnetic field biasing means comprises a first electrical conductor means adapted to conduct selectively a first electrical current in a direction perpendicular to said second direction and a second electrical current in a direction perpendicular to said fourth direction.

20. The sensor of claim 19 wherein said first, second, third, and fourth directions lie in a common plane.

21. The sensor of claim 20 wherein said magnetic field sensing means includes first, second, third, and fourth electrical resistance means, each of said electrical resistance means including a magneto resistive material and having first and second terminating regions, said first electrical resistance means first terminating region being electrically connected to said third electrical resistance means first terminating region said first electrical resistance means second terminating region being electrically connected to said second electrical resistance means second terminating region, said third electrical resistance means second terminating region being electrically connected to said fourth electrical resistance means second terminating region and said second electrical resistance means first terminating region being electrically connected to said fourth electrical resistance means first terminating region.

22. The sensor of claim 21 wherein said first direction is perpendicular to said third direction.

23. The sensor of claim 22 wherein said first direction is perpendicular to said second direction and said third direction is perpendicular to said fourth direction.

24. The sensor of claim 23 wherein said first electrical resistance means comprises a plurality of major legs, each of said first electrical resistance means major legs lying at an angle of 45° with respect to said first direction, said second electrical resistance means comprises a plurality of major legs each of said second electrical resistance means major legs lying perpendicular to said first electrical resistance means major legs, said third electrical resistance means comprises a plurality of major legs, each of said third electrical resistance means major legs being perpendicular to said first electrical resistance means major legs, and said fourth electrical resistance means comprises a plurality of major legs, each of said fourth electrical means major legs being parallel to said first electrical resistance means major legs.

25. The sensor of claim 24 wherein said magnetoresistive material includes an iron-nickel alloy.

* * * * *